United States Patent [19]

Kitamura

[11] Patent Number: 5,477,049
[45] Date of Patent: Dec. 19, 1995

[54] PARTICLE ANALYSIS METHOD

[75] Inventor: Tadashi Kitamura, Tokyo, Japan

[73] Assignee: Seiko Instruments Inc., Tokyo, Japan

[21] Appl. No.: 184,122

[22] Filed: Jan. 21, 1994

[51] Int. Cl.$^6$ .................................................... H01J 37/29
[52] U.S. Cl. ........................................ 250/307; 250/310
[58] Field of Search ...................................... 250/307, 310

[56] References Cited

U.S. PATENT DOCUMENTS

| | | | |
|---|---|---|---|
| 4,020,343 | 4/1977 | Shimaya et al. | 250/310 |
| 4,814,829 | 3/1989 | Kosugi et al. | 355/43 |
| 5,231,287 | 7/1993 | Sekine et al. | 250/310 |

*Primary Examiner*—Bruce C. Anderson
*Attorney, Agent, or Firm*—Loeb & Loeb

[57] ABSTRACT

Using a scanning type electron microscope, a spot where a particle is detected is determined by acquiring the evaluation of detection of particles on the surface of a wafer, etc., based on the coordinate information of a particle spot, by particle detection equipment, from the image within the view, shifting the view from the most probable spot of particle existence to less probable spots in sequence, and manipulating evaluation of detection as follows; supposing that the variance of histogram of the image is $\sigma$, and that the value N is equal to or more than 3, which is empirically known, and assuming that the spots where the data out of the range of $\pm N\sigma$ exist is that of particles detected, pixels of particles are counted. In this manipulation, weighting corresponding to the spot of histogram and weighting corresponding to the mean of intensity of detection at the neighborhood of particles are executed.

2 Claims, 4 Drawing Sheets

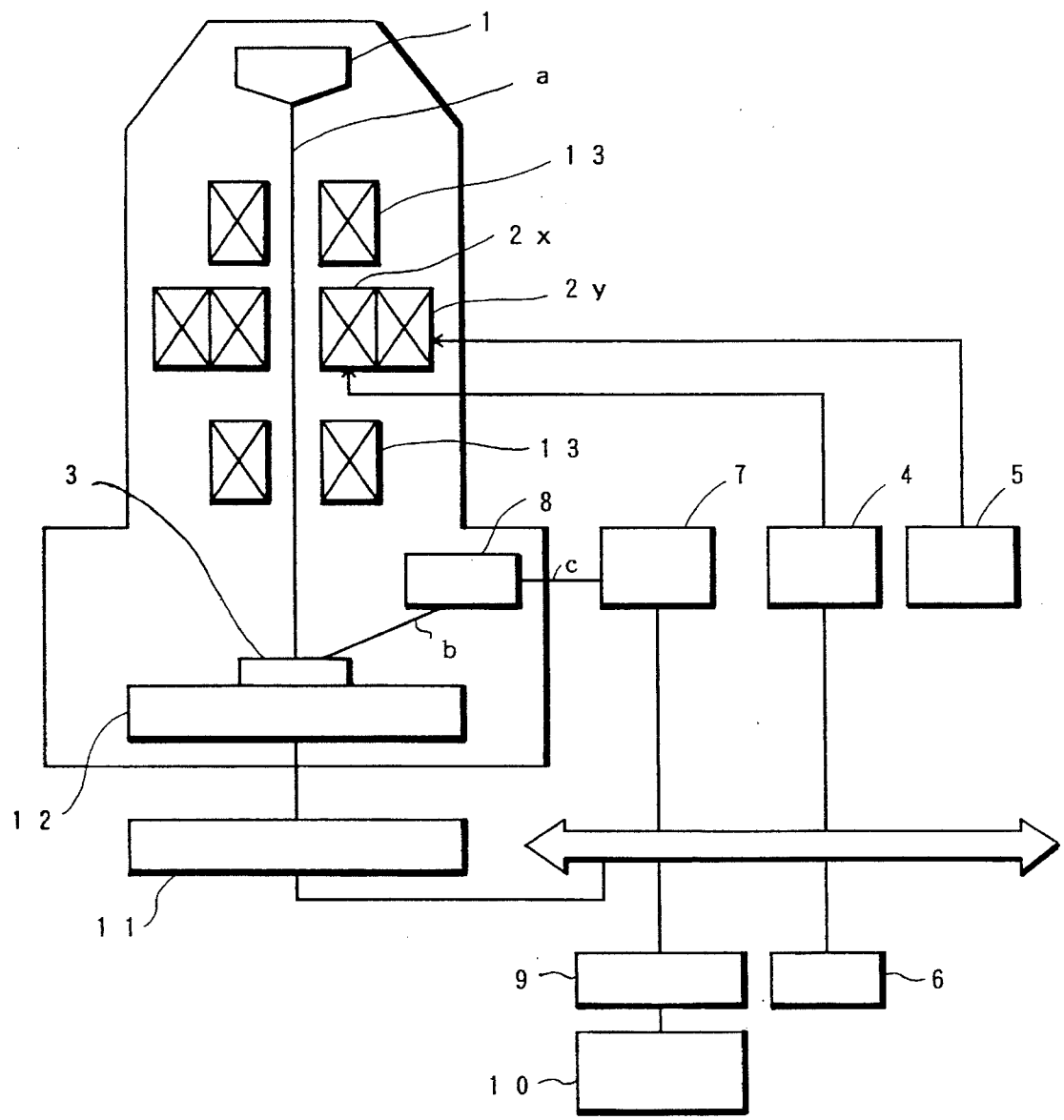
F I G. 1

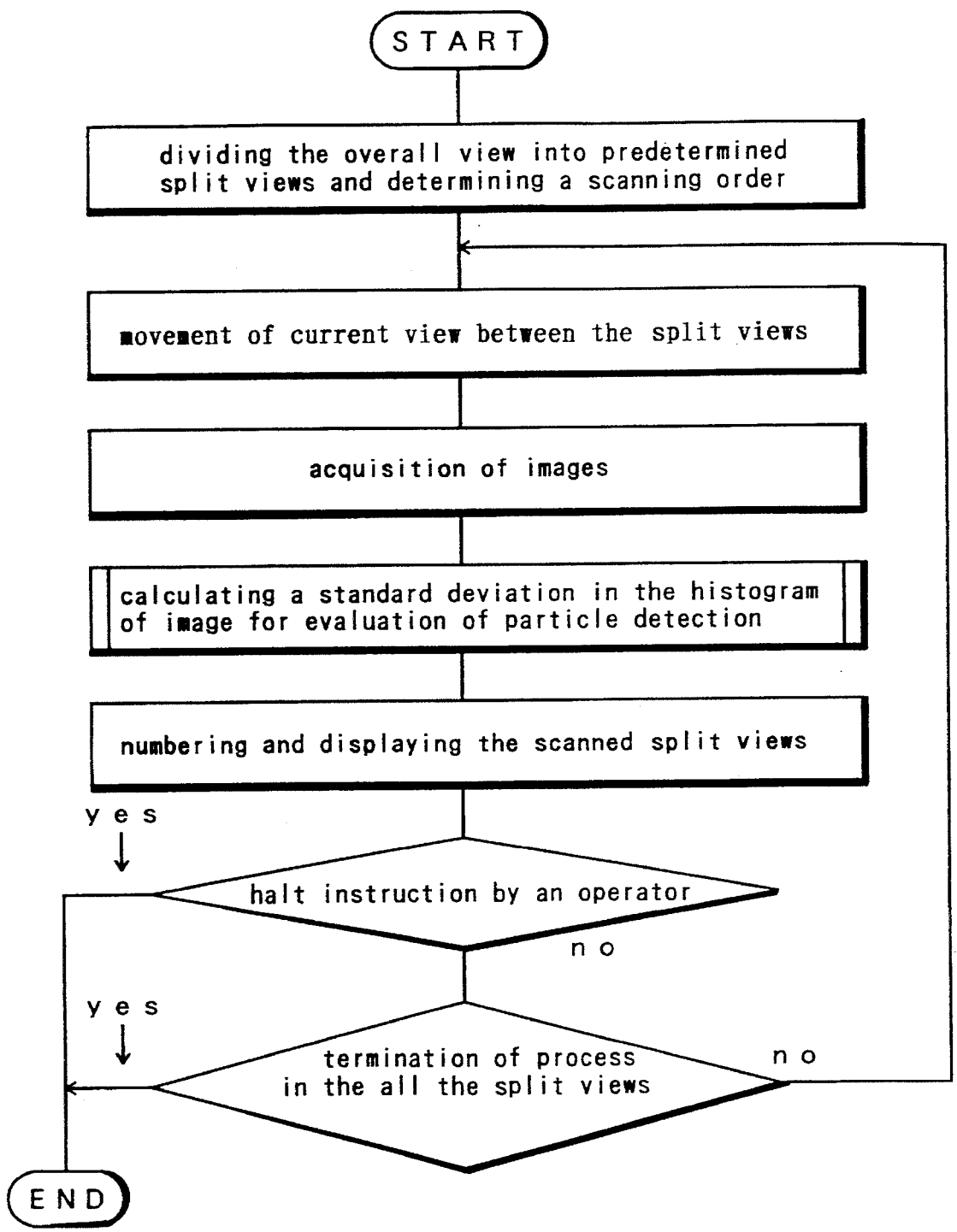
F I G. 2

PARTICLE ANALYSIS METHOD

BACKGROUND OF THE INVENTION

This invention relates to a particle analysis method for analyzing particles on a sample which has a simple pattern surface.

Since speedy observation of an entire surface with particle analysis equipment is not impossible, after speedy observation of an entire surface is effected at first with particle detection equipment detecting diffusion light, etc., then based on the coordinate information of particles obtained by the particle detection equipment, an element analysis and a shape-observation of specific particles are usually accomplished in detail using particle analysis equipment.

If the error between the coordinate information of a particle in particle detection equipment and that corresponding to the above information in particle analysis equipment is greater than the view for the surveying of particles in particle analysis equipment, it is difficult to detect a particle by one trial of observation and the survey operator has to find particles by shifting the view consecutively and checking the image at each view.

This method not only places a burden on the survey operator because it is troublesome and time-consuming, but also leads to mistakes which very often causes some of the particles to be overlooked. Therefore adding an automatic survey function for this process to particle analysis equipment is required to remove these burdens and eliminate these mistakes.

SUMMARY OF THE INVENTION

It is therefore an object of the invention to provide a survey function which offers the above-mentioned benefits.

The above and other objects are achieved, according to the present invention, by a particle analysis method performed with a scanning type electron microscope which directs a narrow, focussed electron beam through an electromagnetic lens onto a surface of a sample mounted on a high precision stage in scanning, produces a detection signal representing intensity of secondary electrons or reflected electrons from the sample surface, and displays a representation of the sample surface based on the detection signal, the method comprising the steps of: reading the image by controlling the electron microscope by automatically shifting views produced by scanning the electron beam from a most probable spot where particles may exist to less probable spots in sequence based on information contained in the signal of coordinates of a particle location; determining the particle detection location and acquiring a detection evaluation value in the image, under the assumption that the normal distribution portion of a histogram of detection intensity is due to a simple pattern and that the rest of the distribution of the histogram is due to a particle; and scanning a location where particles are determined to exist based on the result of the determining step.

In the performance of the method according to the invention, the high-precision stage of particle analysis equipment is shifted until a position coordinate which corresponds to that of a particle in the particle detection equipment comes into the center of the field of view. Next, observation of a particle is executed with a field of view which covers an error range between the position coordinate from the particle detection equipment and an actual position coordinate in the particle analysis equipment. In case that the particle is not found in the field of view, the particle is automatically searched by the following procedure.

The overall field of view is divided into a plurality of predetermined views which are appropriate to detecting of the particle according to the size of particle. The divided view is called a split view hereinafter and the magnification value is set according to the split view. The scanning order of split views is determined in that the first scanning is for the center split view, the next is for that which is closer to the center split view and the next to the former one. With the sequence above, the split view scanned is automatically changed in particle analysis equipment. An image based on detection intensity of each position is obtained after the scanning is finished and the detection evaluation of the particle is calculated.

The detection evaluation which is used here is acquired as follows. Since a particle has not a simple, but a complex, shape, it is already empirically known that the intensity of detection is observed clearly and that the histogram of intensity detection of the observed portion, except for the particle, follows a normal distribution and in case that the particle is small enough, the effect from the particle portion can be disregarded in statistical calculation of mean and standard deviation. Therefore, obtaining the mean M and the standard deviation σ from the histogram above which is assumed to follow normal distribution, $$M \pm N\sigma$$

where N is an empirical datum and $N \geq 3$ assuming that data within $M \pm N\sigma$ should be a simple pattern, then the residual portion can be regarded as the distribution of the particle. The spot on the image left out of the range above (which is the residual) can be assumed as the spot of the particle detected. Through weighting corresponding to the spot of the histogram of intensity detection, the number of picture elements counted, which is generated by particles, turns to be the evaluation of detection. This weighting is an operation for decreasing the effect by a simple pattern portion and then for easier acquisition of particle data in detecting.

Moreover, in order to improve the detectability of particles which are relatively lower and spread more broadly in terms of intensity of detection, weighting is done with the average of intensity of detection in the neighborhood of the particles. Through this operation, the detection efficiency is improved.

The operation is described in more concrete terms as follows. A split image is divided into small blocks of Nx by Ny pixels (picture elements) as shown in FIG. 4 and the histogram of intensity detection is drawn for each small block above, the histogram being shown in FIG. 5. By way of adding the frequency of each interval in the histogram of detection intensity of the small blocks, the histogram of the total data is obtained, the histogram being shown in FIG. 6 and finally the average M and standard deviation σ of the total data of detection intensity can be obtained. Assuming that N can be equal to or greater than 3 as an empirical datum, and supposing that data out of the range of $M \pm N\sigma$ can be particles in the histogram of detection intensity, the number of pixels generated by particles is counted. After this counting, a weighting term $W_h$, which corresponds to the spot in the histogram of detection intensity, multiplied by a weighting term We, which corresponds to the average of detection intensity at the neighborhood of particles, is derived.

Now, $W_h(x) = \exp((x-M)^2/(2 \cdot \sigma^2))$ where $W_h$: inverse number of detection probability which forms normal distribution, x: spot of histogram of detection intensity.

And for the purpose of high-speed processing, $W_a$ is calculated, assuming that the mean of detection intensity at the neighborhood of particles is equal to the mean of detection intensity in the small block where particles exist.

Firstly, the mean of detection intensity for each block is acquired from the histogram of detection intensity. Whereas this mean for each block is supposed to be $M_a$, standard deviation $\sigma_a$ is calculated using this $M_a$. Suppose that $x_a$ is the spot of the mean of detection intensity in each block, and that $N_a$ is equal to or greater than 3, which is empirically acquired, and in case that the $X_a$ exceeds $M_a \pm N_a \sigma_a$ $$W_a(x_a) = \exp((x_a - M_a)^2 / (2 \cdot \sigma_a^2))$$

and in case that the $x_a$ is within $M_a \pm N_a \sigma_a$, $W_a$ is regarded as 1. The mean in each small block of detection intensity corresponds to $W_h$ in the case that the small block corresponds to the one pixel (picture element) in the image which is obtained when the magnifying power is lowered.

BRIEF DESCRIPTION OF THE DRAWING

FIG. 1 is a block diagram of an embodiment of apparatus used to practice the present invention.

FIG. 2 is a flow-chart of a process for acquiring particle spots to be detected.

DESCRIPTION OF THE PREFERRED EMBODIMENTS

Figure 3:
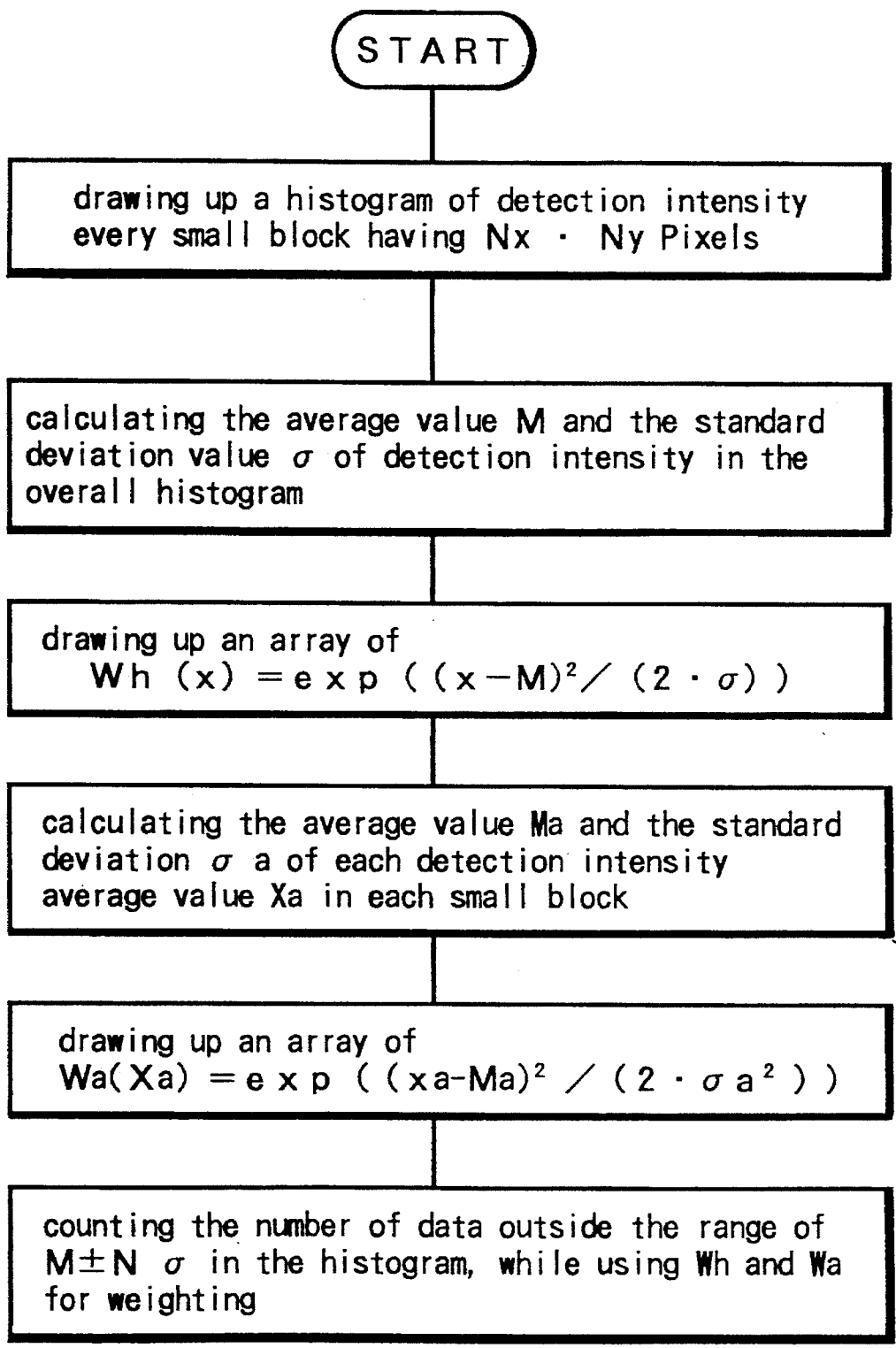
FIG. 3 is a flow-chart of an embodiment of the evaluation process according to the invention.
Figure 4:
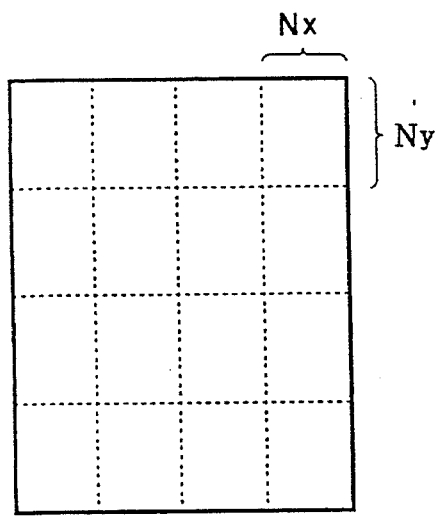
FIG. 4 is a pictorial view of a small block and histogram.
Figure 5:
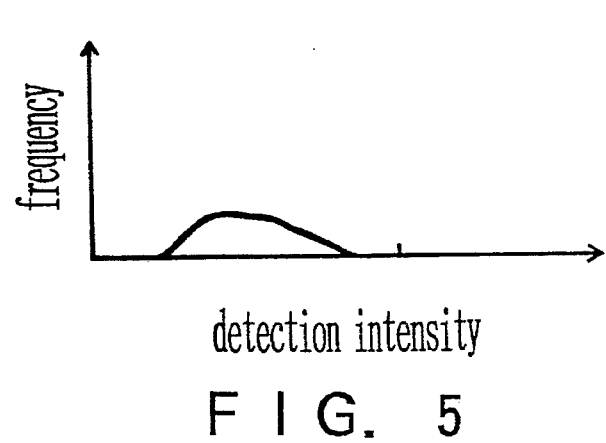
FIGS. 5 and 6 are diagrams illustrating a detection operation according to the invention.
Figure 6:
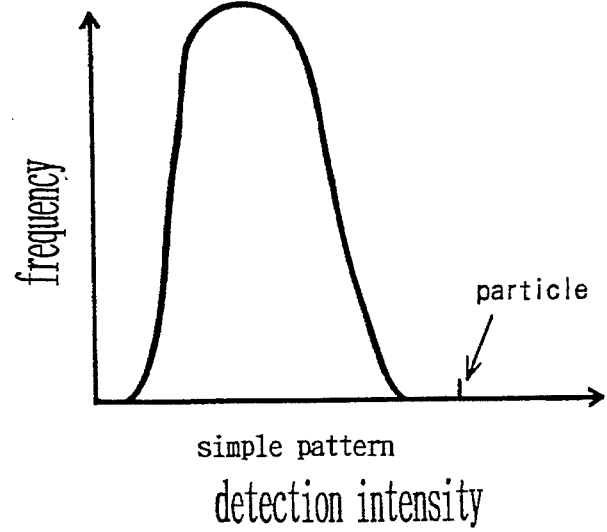

Hereinafter is explained this invention according to the embodiment shown in the Figures.

FIG. 1 shows an embodiment of apparatus used to practice the present invention. An electron beam a generated by an electron gun 1 is deflected by an x-direction deflecting system 2x in the x direction and also is deflected by a y-direction deflecting system 2y in the Y direction, perpendicular to the X direction. In FIG. 1, one of these directions is a horizontal direction in the plane of the figure and the other direction is perpendicular to the plane of the figure. The magnitude of the deflections is given to a D/A converter 4 for the x direction and to a D/A converter 5 for the y direction by a CPU 6. The outputs of D/A converters 4, 5 are supplied to x-direction deflecting system 2x and y-direction deflecting system 2y, respectively.

After CPU 6 reads data from an A/D converter 7, electrons b generated from a sample 3 are detected by a detector 8 and the resulting electronic signals c which are produced by detector 8 are converted by a converter 7 to digital values which are input into CPU 6.

CPU 6 writes the values inputted from A/D converter 7 into an image memory 9. The contents of image memory 9 are displayed on a display unit 10.

CPU 6 supplies to a stage control unit 11 an indication of how far the stage shifts. The output from stage control unit 11 is coupled to a stage drive unit 12.

Electron beam a is focussed to a small diameter by focussing coils 13.

The procedure according to the invention will be explained hereunder according to the flow-chart in FIG. 2.

To create a prestoring condition, the total view represented by signals c is divided into split views, which are appropriate to detection of particles corresponding to the particle size and the scanning order of all the split views is determined. According to this scanning order, all the split views are automatically scanned by position control of high precision stage 11, 12 or by deflecting systems 2x, 2y. By acquiring the image of each view, the evaluation of detection of particles is manipulated by the steps shown in the flow chart of FIG. 3, which shows a procedure for achieving the result described earlier herein. After the manipulation above concerning the split view, numbering of the scanned split views in the order from the largest evaluation of detection to the smallest and recognition of portion of particle within the views is executed and then the result above is displayed to the observing operator.

In case that a halt instruction is not generated by the operator and the above process for all the split views is not finished, scanning to the next split view is processed.

Another method is as follows: determining beforehand the predetermined evaluation value of detection concerning the existence or not of one or more particles, and using this predetermined value, deciding that there exists a particle in case that the evaluation value of detection acquired is larger than the predetermined value, and then processing is terminated.

In this invention, not only an operator's load can be decreased, but also the probability of the operator's overlooking particles by mistake can be decreased since there exists sufficient detectability even though the image generated by a particle is only at a spot or spreads thinly and broadly over the split views.

This application relates to subject matter disclosed in Japanese Application numbers 4-195412, filed on Jul. 22, 1992 and 4-195413, filed on Jul. 22, 1992, the disclosures of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A particle analysis method for analyzing particles on a sample in a scanning type electron microscope which directs a narrow, focussed electron beam through an electromagnetic lens onto a surface of a sample mounted on a high precision stage in scanning, produces a detection signal representing intensity of secondary electrons or reflected electrons from the sample surface, and displays an image of the sample surface based on the detection signal, said method comprising the steps of:

reading the image by controlling the electron microscope by automatically shifting views produced by scanning the electron beam from a most probable spot where a particle may exist to less probable spots in sequence based on information contained in the signal of coordinates of a particle location;

calculating a standard deviation in a histogram of the image for evaluation of detection of such particle;

determining the particle location and acquiring a detection evaluation value in the image, under the assumption that the normal distribution portion of the histogram is due to a simple pattern and that the rest of the distribution of the histogram is due to a particle; and scanning a location where such particles determined to exist based on the result of said determining step.

2. The method of claim 1, wherein said step of reading the image further comprises: shifting the high precision stage until a position coordinate which corresponds to that of a particle detected in a particle detection equipment, which observes an entire surface of the sample, comes into the center of the field of view of the high precision stage; dividing the field of view into a plurality of predetermined views which are appropriate for detecting; scanning the predetermined views in sequence in an order determined in that a first scanning is for a center view, and a second scanning is for a view which is closer to the center view, and obtaining an image based on detection intensity of each view after said scanning is finished.

* * * * *